(12) United States Patent
Ogura

(10) Patent No.: US 9,134,595 B2
(45) Date of Patent: Sep. 15, 2015

(54) PHOSPHOR DEVICE, ILLUMINATION APPARATUS AND PROJECTOR APPARATUS

(71) Applicant: Casio Computer Co., Ltd., Tokyo (JP)

(72) Inventor: Naotsugu Ogura, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 264 days.

(21) Appl. No.: 13/626,105

(22) Filed: Sep. 25, 2012

(65) Prior Publication Data

US 2013/0083296 A1    Apr. 4, 2013

(30) Foreign Application Priority Data

Sep. 29, 2011   (JP) ................................. 2011-214620
Sep. 29, 2011   (JP) ................................. 2011-214636

(51) Int. Cl.
*F21K 2/00*        (2006.01)
*G03B 21/20*       (2006.01)
*H01L 33/50*       (2010.01)

(52) U.S. Cl.
CPC .............. *G03B 21/204* (2013.01); *H01L 33/50* (2013.01); *F21K 2/00* (2013.01)

(58) Field of Classification Search
USPC ..................... 362/84, 293; 313/483, 501, 502
See application file for complete search history.

(56) References Cited

U.S. PATENT DOCUMENTS

| | | | | |
|---|---|---|---|---|
| 5,813,753 | A  * | 9/1998  | Vriens et al. | 362/293 |
| 6,870,311 | B2 * | 3/2005  | Mueller et al. | 313/491 |
| 8,096,668 | B2 * | 1/2012  | Abu-Ageel | 362/84 |
| 8,337,030 | B2 * | 12/2012 | Pickard | 362/84 |
| 8,459,814 | B2 * | 6/2013  | Su et al. | 362/84 |
| 2004/0233664 | A1 | 11/2004 | Beeson et al. | |
| 2006/0227302 | A1 | 10/2006 | Harbers et al. | |
| 2007/0081336 | A1 | 4/2007  | Bierhuizen et al. | |
| 2008/0030984 | A1 | 2/2008  | Harbers et al. | |
| 2010/0202129 | A1 * | 8/2010  | Abu-Ageel | 362/84 |
| 2010/0320479 | A1 * | 12/2010 | Minato et al. | 257/88 |
| 2010/0328617 | A1 | 12/2010 | Masuda | |

(Continued)

FOREIGN PATENT DOCUMENTS

CN    101123286 A    2/2008
CN    101162745 A    4/2008

(Continued)

OTHER PUBLICATIONS

Partial European Search Report (PESR) dated Jan. 28, 2013 (in English) issued in counterpart European Application No. 12186023.3.

(Continued)

*Primary Examiner* — William C Dowling
(74) *Attorney, Agent, or Firm* — Holtz, Holtz, Goodman & Chick PC

(57) ABSTRACT

A phosphor device contains phosphor particles for emitting light beams, is shaped like a pyramid or cone and includes first and second faces opposed to each other and having different areas. The first face and the inclined faces have reflection layers configured to reflect light beams emitted from the phosphor particles. The second face a reflection preventing film and is an input face for excitation light and also an output face for the light beams. A first film is provided on the first face and parts of the incline faces, allows passage of excitation light and reflects light beams toward the second face.

19 Claims, 12 Drawing Sheets

(56) References Cited

U.S. PATENT DOCUMENTS

| | | | |
|---|---|---|---|
| 2011/0157865 A1 | 6/2011 | Takahashi et al. | |
| 2011/0204405 A1 | 8/2011 | Tsutsumi et al. | |
| 2012/0092850 A1* | 4/2012 | Pickard | 362/84 |
| 2012/0178193 A1 | 7/2012 | Lei et al. | |

FOREIGN PATENT DOCUMENTS

| | | |
|---|---|---|
| CN | 101514784 A | 8/2009 |
| CN | 101697367 A | 4/2010 |
| CN | 101878540 A | 11/2010 |
| CN | 101887939 A | 11/2010 |
| EP | 1 605 199 A2 | 12/2005 |
| JP | 2003-258308 A | 9/2003 |
| JP | 2005328921 A | 12/2005 |
| JP | 2006-282447 A | 10/2006 |
| JP | 2009134965 A | 6/2009 |
| JP | 2009267040 A | 11/2009 |
| JP | 2010-24278 A | 2/2010 |
| JP | 2010198805 A | 9/2010 |
| JP | 2010256457 A | 11/2010 |
| JP | 2011013315 A | 1/2011 |
| JP | 2011142006 A | 7/2011 |
| JP | 2011154995 A | 8/2011 |
| JP | 2011180353 A | 9/2011 |
| JP | 2012098438 A | 5/2012 |
| JP | 2013057850 A | 3/2013 |
| TW | 200604466 A | 2/2006 |
| TW | M309750 U | 4/2007 |
| WO | 2010044239 A1 | 4/2010 |

OTHER PUBLICATIONS

Chinese Office Action dated Feb. 7, 2014 (and English translation thereof) in counterpart Chinese Application No. 201210371163.1.

Chinese Office Action (and English translation thereof) dated Mar. 9, 2015, issued in counterpart Chinese Application No. 201210371163.1.

Taiwanese Office Action dated Mar. 24, 2015 (and English translation thereof), issued in counterpart Taiwanese Application No. 101135718.

Japanese Office Action (and English translation thereof) dated Jul. 14, 2015, issued in counterpart Japanese Application No. 2011-214636.

Japanese Office Action (and English translation thereof) dated Jul. 28, 2015, issued in counterpart Japanese Application No. 2011-214620.

* cited by examiner

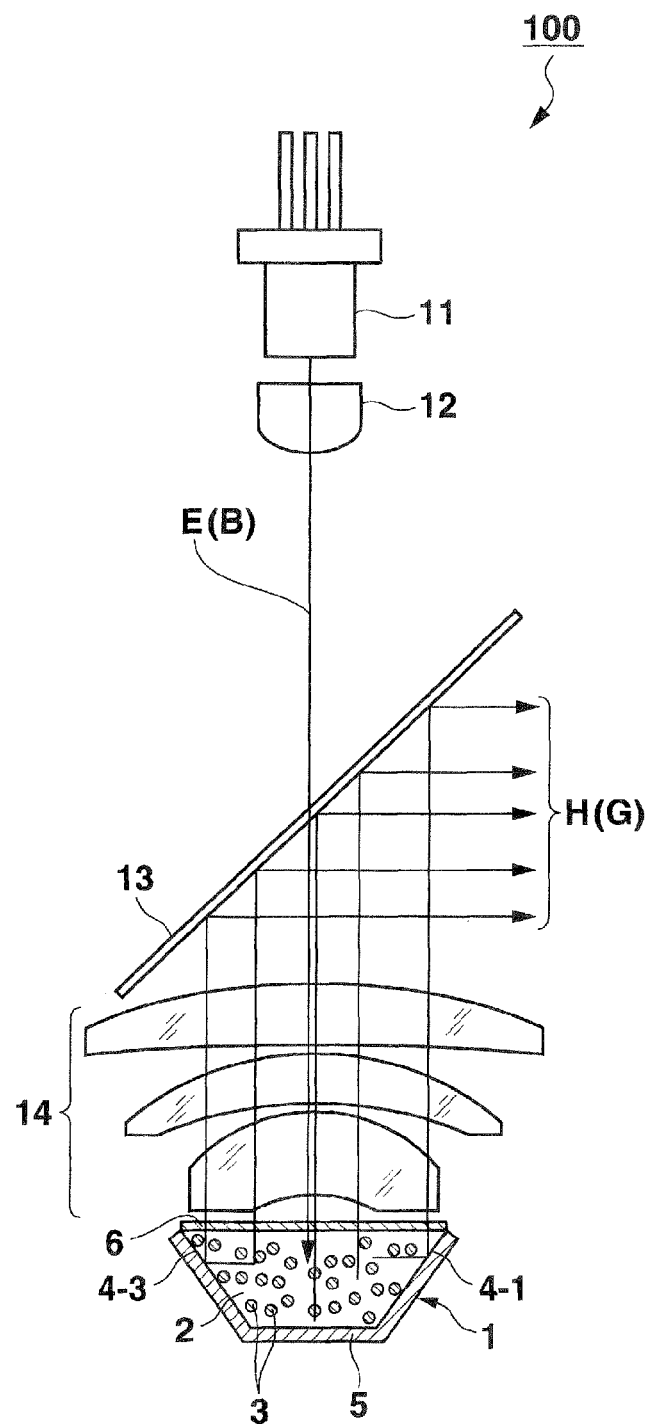

PHOSPHOR DEVICE, ILLUMINATION APPARATUS AND PROJECTOR APPARATUS

CROSS-REFERENCE TO RELATED APPLICATIONS

This application is based upon and claims the benefit of priority under 35 USC 119 of Japanese Patent Application No. 2011-214620 filed on Sep. 29, 2011 and No. 2011-214636 filed on Sep. 29, 2011, the entire disclosures of which, including the description, claims, drawings, and abstract, are incorporated herein by reference in their entirety.

BACKGROUND OF THE INVENTION

1. Field of the Invention

The present invention relates to a phosphor device, and an illumination apparatus and projector apparatus, both using the phosphor device.

2. Description of the Related Art

Some light source apparatuses use a phosphor that emits a light beam having a wavelength different from that of the excitation light coming from a light source and applied to the phosphor. The light source apparatus of this type is utilized as a light source in, for example, illumination apparatuses and image display apparatuses.

The light source apparatus of this type has a light source, which is a semiconductor light source, such as a light emitting diode (LED) or a laser diode (LD), in most cases. In the light source, phosphor particles are dispersed in a resinous binder, such as transparent silicone or epoxy resin, forming a light emitting layer.

The resinous binder may be degraded with the excitation light coming from the semiconductor source, or may be damaged if the excitation light has high intensity. The resin, such as silicone or epoxy resin, in which the phosphor is dispersed, has low thermal conductivity. The temperature of the phosphor therefore rises, inevitably shifting the emission wavelength of the phosphor or causing a phenomenon such as temperature quenching that lowers the emission intensity. Consequently, the luminance the light source apparatus achieves will decrease.

A technique which involves use of an inorganic transparent material such as transparent silicone or epoxy resin as a binder in place of a resinous binder is known. Jpn. Pat. Appln. KOKAI Publication No. 2003-258308 discloses the use of a transparent inorganic material such as glass. Jpn. Pat. Appln. KOKAI Publication No. 2006-282447 and Jpn. Pat. Appln. KOKAI Publication No. 2010-024278 discloses the use of a ceramic having high thermal conductivity.

The light emitting layer composed of the transparent ceramic binder and phosphor is used in place of the above-mentioned phosphor layer composed of the resinous binder and phosphor in most cases. Inevitably, the transparent ceramic binder does not have a structure fit for use in a light source apparatus configured to emit light from phosphor.

BRIEF SUMMARY OF THE INVENTION

An object of this invention is to provide a phosphor device having a structure fit for emitting light from a phosphor and able to emit, at high efficiency, the light emanating from the phosphor, and provide an illumination apparatus and projector apparatus that incorporate the phosphor device.

A phosphor device according an aspect of the present invention comprises: a body containing phosphor particles, shaped like a pyramid or cone and including an inclined face and first and second faces opposed to each other. The first face includes a smaller area than the second face, the first face and the inclined faces includes reflection layers configured to reflect light beams emitted from the phosphor particles with a wavelength in a visible-light region. The second face includes a reflection preventing layer configured to allow passage of the light beams emitted from the phosphor particles. The second face is an input face for excitation light for exciting the phosphor particles and also an output face for the light beams emitted from the phosphor particles.

A phosphor device according another aspect of the present invention comprises: a body containing phosphor particles, shaped like a pyramid or cone and including an inclined face and first and second faces opposed to each other. The first face includes a smaller area than the second face. A first film is provided on the first face and parts of the incline faces, which allows passage of excitation light for exciting the phosphor particles and reflects light beams emitted from the phosphor particles, toward the second face. The light beams pass through the second face and emerge from the body.

This invention can therefore provide a phosphor device, an illumination apparatus and a projector apparatus, each having a configuration fit for emitting light beams from phosphor particles, and can therefore emit the light beams at high efficiency.

BRIEF DESCRIPTION OF THE SEVERAL VIEWS OF THE DRAWING

The present invention will be better understood from the following detailed description and the accompanying drawings. Nonetheless, the description and drawings are provided to illustrate embodiments of the invention, and not to limit the scope of the invention.

FIG. 2 is a diagram showing the configuration of an illumination apparatus according to a second embodiment of the invention, which uses the phosphor device;

DETAILED DESCRIPTION OF THE INVENTION

First Embodiment

Figure 1A:
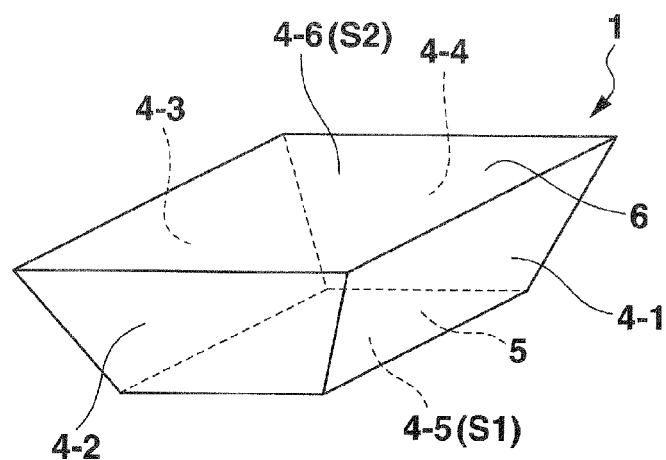
FIG. 1A is a diagram showing the configuration of a phosphor device according to a first embodiment of this invention.

A first embodiment of this invention will be described with reference to the drawing.

Figure 1B:
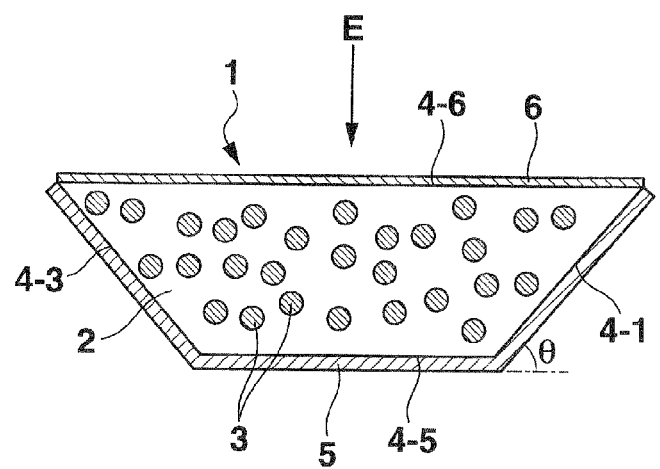
FIG. 1B is a sectional view of the device.

FIG. 1A and FIG. 1B show the configuration of a phosphor device 1 according to the first embodiment. FIG. 1A is a perspective, and FIG. 1B is a sectional view. The phosphor device 1 is a sintered body composed of a transparent inorganic material 2 (hereinafter referred to as "inorganic binder"), such as $Al_2O_3$, and phosphor particles 3, such as Yang's particles. The phosphor particles 3 are dispersed in the inorganic binder 2 and spaced apart at, for example, the same distance. The phosphor particles 3 emit green light (having a wavelength of 492 to 577 nm) when illuminated with excitation light E, for example, blue light (having a wavelength of 455 to 492 nm).

The phosphor device 1 has been formed by sintering the inorganic binder 2 and phosphor 3 together, and is shaped like a pyramid or cone, for example, a square truncated pyramid. The phosphor device 1 is not limited to one so shaped. Rather, it may be shaped like a hexagonal pyramid, a square pyramid, or a cone.

Shaped like a square truncated pyramid, the phosphor device 1 has four lateral faces 4-1 to 4-4d and first and second faces 4-5 and 4-6 parallel and opposed to each other.

The four lateral faces incline, defining a square pyramid. Each lateral face inclines at an inclination angle θ. The lateral face 4-1, for example, inclines at, for example, 45° to the first face 4-5, as shown in FIG. 1B. The other lateral faces 4-2 to 4-4 also incline at, for example, 45° to the first face 4-5.

The first face 4-5 and the second face 4-6 intersect with the lateral faces 4-1 to 4-4. The first face 4-5 has area S1. The second face 4-6 has area S2. The area S1 of the first face 4-5 has area S1 is smaller than the area S2 of the second face 4-6.

On the first face 4-5 and the lateral faces 4-1 to 4-4, reflection layers 5 are formed. The reflection layers 5 are reflection films made of a metal such as silver or aluminum, or made of multi-layered optical reflection films, each composed of a metal oxide or fluoride layers laid one on another. The reflection layers 5 reflect light having a wavelength in a visible-light region of 455 nm to 577 nm, namely in the blue region (455 nm to 492 nm) and in the green region (492 nm to 577 nm). Covered with the reflection layers 5, the first face 4-5 and the lateral faces 4-1 to 4-4 function as reflection faces that reflect fluorescent light having a wavelength within the visible-light region, i.e., the light each phosphor particle 3 emits. Hereinafter, the first face 4-5 shall be called "flat reflection face 4-5" and the lateral faces 4-1 to 4-4 "inclined reflection faces 4-1 to 4-4."

The second face 4-6 receives the excitation light E from outside the phosphor device 1 and outputs the light emitted from each phosphor particle 3 from the phosphor device 1. The second face 4-6 shall hereinafter be referred to as "input/output face 4-6." On the input/output face 4-6, a thin reflection preventing film 6 is formed. The reflection preventing film 6 prevents the reflection of light having a wavelength outside, for example, a visible-light region of 400 nm to 700 nm. The reflection preventing film 6 is made of, for example, a metal oxide or a metal fluoride. Representative examples of the metal oxide are TiO2, SiO2, and Al2O3. A representative example of the metal fluoride is MgF2. The reflection preventing film 6 may have tiny depressions and projections arranged at a pitch shorter than, for example, a wavelength in the visible-light region. The reflection preventing film 6 has been formed by transferring the pattern from a mold or by etching a film, at the time of sintering during the manufacture of the phosphor device 1.

When the excitation light E, e.g., blue light (having a wavelength ranging from 455 to 492 nm), is applied to the input/output face 4-6 of the phosphor device 1 so configured as described above, it illuminates the phosphor particles 3 dispersed in the inorganic binder 2. Each phosphor particle 3 is excited with the excitation light E, and emits light having a given wavelength distribution. For example, each phosphor particle 3 emits green light (having a wavelength ranging from 492 to 577 nm). Since each phosphor particle 3 emits light uniformly in all directions, the light is radiated in all directions in the inorganic binder 2.

The light emitted from each phosphor particle 3 to the input/output face 4-6 passes the input/output face 4-6 and emerges outside the phosphor device 1.

The light each phosphor particle 3 emits to the flat reflection face 4-5 is reflected by the reflection layer 5 formed on the flat reflection face 4-5, and travels to the input/output face 4-6, passes the input/output face 4-6 and emerges outside the phosphor device 1.

The light emitted from each phosphor particle 3 to the inclined reflection faces 4-1 to 4-4 is reflected by the reflection layers 5 formed on the inclined reflection faces 4-1 to 4-4, respectively, and then travels to the input/output face 4-6.

Of the light beams radiated from each phosphor particle 3, some beams are reflected by the reflection layer 5 formed on the flat reflection face 4-5, further reflected by the refection layer 5 formed on the inclined reflection faces 4-1 to 4-4, then travel to the input/output face 4-6, further pass the input/output face 4-6, and finally emerge outside the phosphor device 1.

Since the inclined reflection faces 4-1 to 4-4 are the lateral faces of a square truncated pyramid, each inclined at, for example, 45°, the light beams reflected at the inclined reflection faces 4-1 to 4-4, respectively, are efficiently guided to the input/output face 4-6, pass the input/output face 4-6, and emerge outside the phosphor device 1.

In the phosphor device 1 according to the first embodiment, an inorganic binder 2 includes a dispersion of phosphor particles 3 shaped like a square truncated pyramid and with four inclined reflection faces 4-1 to 4-4, and a flat reflection face 4-5 and an input/output face 4-6, which are parallel to each other. On the inclined reflection faces 4-1 to 4-4 and the flat reflection face 4-5, reflection layers 5 are provided. Of the light beams emitted from each phosphor particle 3 in all directions, some beams emerge outside directly from the input/output face 4-6 in all directions, some beams are reflected by the flat reflection face 4-5, pass the input/output face 4-6 and emerge outside the phosphor device 1, and others are reflected by the reflection layers 5 formed on the inclined reflection faces 4-1 to 4-4, pass the input/output face 4-6 and emerge outside the phosphor device 1. Thus, the light beams emitted from each phosphor particle 3 can be efficiently output from the phosphor device 1.

The phosphor device 1 can achieve the advantage described above, even if it is shaped like a hexagonal pyramid, a square pyramid or a cone, as well as a square truncated pyramid as shown in FIG. 1A and FIG. 1B.

Second Embodiment

A second embodiment of this invention will be described with reference to the drawings.

FIG. 2 is a diagram showing the configuration of an illumination apparatus 100 using the phosphor device 1 described above. The components identical to those shown in FIG. 1A and FIG. 1B are designated by the same reference numbers and will not be described in detail.

The illumination apparatus 100 includes a semiconductor laser 11 used as a source of the excitation light. The semiconductor laser 11 outputs an excitation laser beam (hereinafter referred to as "excitation laser beam E") having a wavelength in, for example, the blue region (4 to 49 nm).

On the path of the excitation laser beam E output from the semiconductor laser 11, a collimator lens 12, a dichroic mirror 13 and a light-collecting optical system 14 are arranged. The dichroic mirror 13 is used as a light output system. The light-collecting optical system 14 is used as an illumination optical system.

The collimator lens 12 collimates the excitation laser beam E output from the semiconductor laser 11.

The light-collecting optical system 14 collects and focuses the excitation laser beam E output from the semiconductor laser 11, and applies the excitation laser beam h to the phosphor device 1.

The dichroic mirror 13 allows passage of the excitation laser beam E collimated by the collimator lens 12 and reflects the light beams H emitted from the phosphor device 1 and coming through the light-collecting optical system 14. The light beams H so reflected are output as illumination light. That is, the dichroic mirror 13 allows the excitation laser beam E in the blue region (455 to 492 nm) to pass through it and reflects the light emitted from the phosphor device 1 and having a wavelength in the green region (492 to 577 nm).

In the illumination apparatus 100 configured as described above, the semiconductor laser 11 outputs an excitation laser beam E having a wavelength in the blue region. The excitation laser beam E is collimated by the collimator lens 12, is applied to the dichroic mirror 13, passes through the dichroic mirror 13, is focused by the light-collecting optical system 14, and is applied to the phosphor device 1.

The excitation laser beam E enters the phosphor device 1 at the input/output face 4-6. In the phosphor device 1, the excitation laser beam E excites the phosphor particles 3 dispersed in the inorganic binder 2. So excited, each phosphor particle 3 emits light beams having a wavelength of, for example, blue light. Of these light beams, some directly emerge from the input/output face 4-6, some are reflected by the reflection layer formed on the flat reflection face 4-5 and then emerge from the input/output face 4-6, and others are reflected by the reflection layers formed on the inclined reflection faces 4-1 to 4-4 and then emerge from the input/output face 4-6.

The light beams having a wavelength in the green region and emitted from the phosphor device 1 pass through the light-collecting optical system 14 and are applied to the dichroic mirror 13. The dichroic mirror 13 reflects these light beams. The light beams so reflected emerge as illumination light.

Thus, in the illumination apparatus 100 according to the second embodiment, which comprises a phosphor device 1, the excitation laser beam E output from the semiconductor laser 11 and having a wavelength in the blue region is applied to the phosphor device 1 through the collimator lens 12, diachronic mirror 13 and light-collecting optical system 14. Excited with the excitation laser beam E, the phosphor particles of the phosphor device 1 emit light beams H having a wavelength in the green region. These light beams pass through the light-collecting optical system 14 and are reflected by the dichroic mirror 13. The light beams H having a wavelength in, for example, the green region are efficiently acquired, as illumination light, from the phosphor device 1.

Third Embodiment

A third embodiment of this invention will be described with reference to the drawings.

Figure 3:
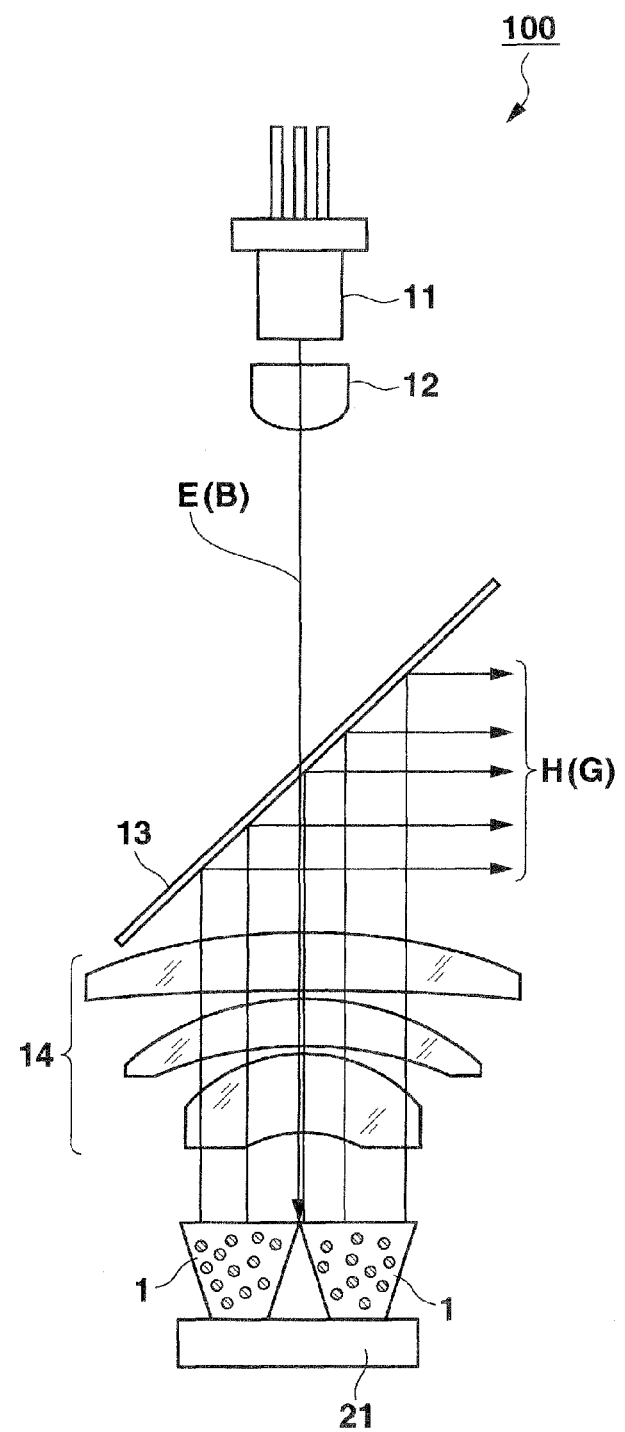
FIG. 3 is a diagram showing the configuration of an illumination apparatus according to a third embodiment of the invention, which uses two phosphor devices.

FIG. 3 is a diagram showing the configuration of an illumination apparatus 200 according to a third embodiment of the invention, which uses two phosphor devices 1. The components identical to those shown in FIG. 1A, FIG. 1B and FIG. 2 are designated by the same reference numbers and will not be described in detail.

Two phosphor devices 1 are formed on, and fixed to, a substrate 2, or formed integral with the substrate 1. The phosphor devices 1 are formed integral with each other, having their input/output face 4-6 arranged in the same plane. The phosphor devices 1 are arranged in a region, where both can receive an excitation laser beam E.

In the illumination apparatus 200 so configured, the laser beam E emitted from the semiconductor laser 11 and having a wavelength in the blue region is collimated by the collimator lens 12 and applied to the dichroic mirror 13. The laser beam E passes through the dichroic mirror 13, is focused by the light-collecting optical system 14 and is applied to the two phosphor devices 1.

At each phosphor device 1, the laser beam E is applied to the input/output face 4-6. Excited with the laser beam 5, each of the phosphor particles 3 dispersed in the inorganic binder 2 emits a light beam having a wavelength in, for example, the green region, as in the illumination apparatus 100 according to the second embodiment. Of the light beams emitted by the phosphor particles 3 of each phosphor device 1, some directly emerge from the input/output face 4-6, some are reflected by the reflection layer formed on the flat reflection face 4-5 and then emerge from the input/output face 4-6, and others are reflected by the reflection layers formed on the inclined reflection faces 4-1 to 4-4 and then emerge from the input/output face 4-6. Thus, the light beams are efficiently emitted from either phosphor device 1.

In the illumination apparatus 200 according to the third embodiment, two phosphor devices 1 formed integral with each other are arranged in one region, where both can receive an excitation laser beam E. The light beams efficiently acquired from the two phosphor devices 1 can therefore be output as illumination light. Since the light beams the phosphor particles 3 generate are efficiently emitted from the two phosphor devices 1, the illumination apparatus 200 can generate more illumination light than by using one phosphor device 1.

Fourth Embodiment

A fourth embodiment of this invention will be described with reference to FIGS. 4A and 4B. The components identical to those shown in FIG. 1A, FIG. 1B, FIG. 2 and FIG. 3 are designated by the same reference numbers and will not be described in detail.

Figure 4A:
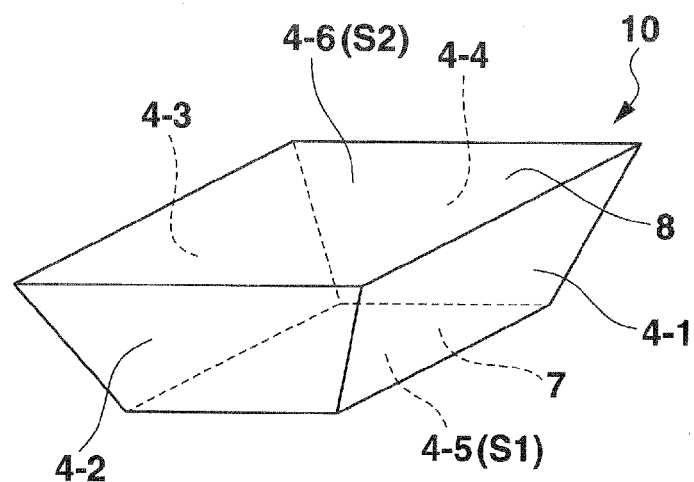
FIG. 4A is a diagram showing the configuration of a phosphor device according to a fourth embodiment of the invention.
Figure 4B:
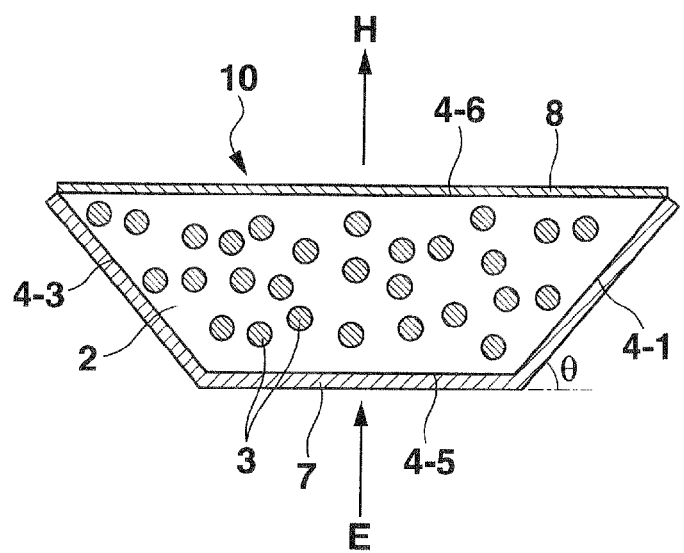
FIG. 4B is a sectional view of the device.

FIG. 4A and FIG. 4B show the configuration of a phosphor device 10. More precisely, FIG. 4A is a perspective view of the phosphor device 10, and FIG. 4B is a sectional view of the phosphor device 10. On the lateral faces 4-1 to 4-4 and first face 4-5 of the phosphor device 10, a dichroic film 7 is formed as first film. The dichotic films 7 allow passage of light having a wavelength in, for example, a region of 455 nm to 492 nm, namely in the blue region, and reflect light having a wavelength in, for example, a region of 493 to 577 nm, namely in the green light emitted from each phosphor particle 3. The dichotic films 7 are made of, for example, a metal oxide or a metal fluoride. Representative examples of the metal oxide are TiO2, SiO2, and Al2O3. A representative example of the metal fluoride is MgF2. The lateral faces 4-1 to 4-4 and the first face 4-5 are input faces for excitation light E. Hereinafter, the lateral faces 4-1 to 4-4 and the first face 4-5 shall be called "input faces 4-1 to 4-4 and 4-5 for excitation light E."

On the second face 4-6, an excitation-light reflecting dichroic mirror 8 is formed as a second film. The excitation-light reflecting dichroic mirror 8 reflects light having a wavelength in, for example, a region of 455 nm to 492 nm, namely excitation light E in the blue region, and allows passage of light having a wavelength in, for example, a region of 493 to 577 nm, namely the green light, emitted from each phosphor particle 3. The excitation-light reflecting dichroic mirror 8 is made of, for example, a metal oxide or a metal fluoride. Representative examples of the metal oxide are TiO2, SiO2, and Al2O3. A representative example of the metal fluoride is MgF2. The second face 4-6 is the output face for the green light emitted from each phosphor particle 3. Hereinafter, the second face 4-6 shall be called "output face 4-6 for green light."

If blue excitation light E (wavelength ranging form 455 nm to 492 nm) enters the phosphor device 10 so configured as described above, at the input faces 4-1 to 4-4 and 4-5, it is applied to the phosphor particles 3 dispersed in the inorganic binder 2. Excited with the excitation light E, each phosphor particle 3 emits light having a given wavelength distribution. For example, each phosphor particle 3 emits green light (a wavelength ranging from 492 to 577 nm). Since each phosphor particle 3 emits light uniformly in all directions, the light is radiated in all directions in the inorganic binder 2.

Of the light beams emitted from each phosphor particle 3, those traveling to the output face 4-6 emerge outside the phosphor device 10, from the output face 4-6.

The light beams radiated from each phosphor particle 3 toward the input face 4-5 are reflected at the dichroic film 7 formed on the input face 4-5, travel to the output face 4-6, and emerge outside the phosphor device 1, from the output face 4-6.

Of the light beams emitted from each phosphor particle 3, some are first reflected by the dichroic film 7 formed on the input face 4-5, then reflected by the dichroic films 7 formed on the lateral faces 4-1 to 4-4, further travel to the output face 4-6 and finally emerge outside the phosphor device 10 from the output face 4-6.

The light beams radiated from each phosphor particle 3 to the lateral faces 4-1 to 4-4 are reflected by the dichroic films 7 formed on the input faces 4-1 to 4-4, respectively, and then travel to the output face 4-6. Since the lateral faces 4-1 to 4-4 are the lateral faces of a square truncated pyramid, each inclined at, for example, 45°, the light beams reflected by the dichroic films 7 formed on the inclined lateral faces 4-1 to 4-4, respectively, are efficiently guided to the output face 4-6, pass the output face 4-6, and emerge outside the phosphor device 10.

Therefore, the light beams emitted from each phosphor particle 3 include light beams traveling directly to the output face 4-6 and light beams which are reflected by the dichroic films formed on the lateral faces 4-1 to 4-4 before traveling to the output face 4-6. These light beams are synthesized, pass through the output face 4-6 and emerge outside the phosphor device 10.

The phosphor device 10 according to the fourth embodiment is shaped like a square truncated pyramid and compose of inorganic binder 2 and phosphor particles 3 dispersed in the binder 2. The phosphor device 10 has four inclined lateral faces 4-1 to 4-4 and two faces 4-5 and 4-6 parallel to each other, i.e., input face 4-5 and output face 4-6. On the four lateral faces 4-1 to 4-4 and the input, face 4-5, the dichotic films 7 are formed. Therefore, of the light beams emitted from each phosphor particle 3 in all directions, some emerge outside the phosphor apparatus 10, directly from the output face 4-6, and some are reflected by the dichroic films 7 formed on entire lateral faces 4-1 to 4-4, respectively, then pass through the output face 4-6 and finally emerge outside the phosphor device 10. Thus, the light beams emitted from each phosphor particle 3 can efficiently emerge outside the phosphor device 10.

The phosphor device 10 is not limited to one shaped like a square truncate pyramid. Rather, it may be shaped like a hexagonal pyramid, a square pyramid or a cone. Even in this case, the phosphor device 10 can achieve the same advantage as the phosphor device 1 according to the first embodiment.

Fifth Embodiment

A fifth embodiment of this invention will be described with reference to FIG. 5.

Figure 5:
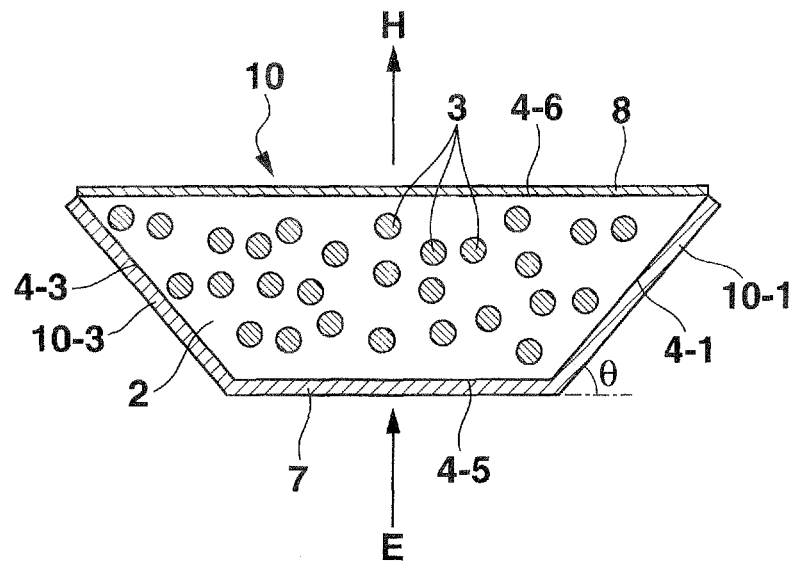
FIG. 5 is a diagram showing the configuration of a phosphor device according to a fifth embodiment of the invention.

FIG. 5 is a sectional view of the phosphor device 10 according to the fifth embodiment. The components identical to those shown in FIG. 4A and FIG. 45 are designated by the same reference numbers and will not be described in detail.

The phosphor device 10 includes the dichroic film 7 formed on the input face 4-5, and four reflection films 10-1 to 10-4 formed on the lateral faces 4-1 to 4-4, respectively. The reflection films 10-1 to 10-4 are formed integral with the lateral faces 4-1 to 4-4. The reflection film 10-4 formed on the lateral face 4-4 is not shown in FIG. 5, because of the viewing direction.

The reflection films 10-1 to 10-4 are configured to reflect light having a wavelength ranging from 492 nm to 577 nm. That is, the reflection films 10-1 to 10-4 reflect green light emitted from each phosphor particle 3. The reflection films 10-1 to 10-4 films are made of a metal such as silver or aluminum, or made of multi-layered optical reflection films, each composed of a metal oxide or fluoride layers laid one on another. The lateral faces 4-1 to 4-4 therefore function as reflection faces that reflect the green light beams emitted from each phosphor particle 3.

If blue excitation light E (wavelength ranging form 455 nm to 492 nm) enters the phosphor device 10 so configured as described above, at the input face 4-5, it is applied to the phosphor particles 3 dispersed in the inorganic binder 2. Excited with the excitation light E, each phosphor particle 3 emits light having a given wavelength distribution. Excited with the excitation light E in the same way as described above, each phosphor particle 3 emits, for example, green light (having a wavelength ranging from 492 nm to 577 nm).

Of the light beams emitted from each phosphor particle 3, some travel to the output face 4-6, pass through the output face 4-6 and emerge outside the phosphor device 10 from the output face 406, and some travel to the input face 4-5, are reflected at the lateral face 4-5, travel to the output face 4-6, pass through the output face 4-6 and emerge outside the phosphor device 10.

The light beams emitted from each phosphor particle 3 to the lateral faces 4-1 to 4-4 are reflected by the reflection films 10-1 to 10-4 and travel to the output face 4-6. The reflection films 10-1 to 10-4 are formed on the lateral faces 4-1 to 4-4 of a square truncated pyramid, and are inclined by, for example, 45°. Therefore, the light beams reflected by the reflection films 10-1 to 10-4 are efficiently guided to the output face 4-6, pass through the output face 4-6 and emerge outside the phosphor device 10.

As described above, the phosphor device 10 according to the fifth embodiment includes the dichroic film 7 formed on the input face 4-5, and four reflection films 10-1 to 10-4 formed on the lateral faces 4-1 to 4-4, respectively. This configuration achieves, needless to say, the same advantage as in the first embodiment described above.

Sixth Embodiment

A sixth embodiment of this invention will be described with reference to FIG. 6.

Figure 6:
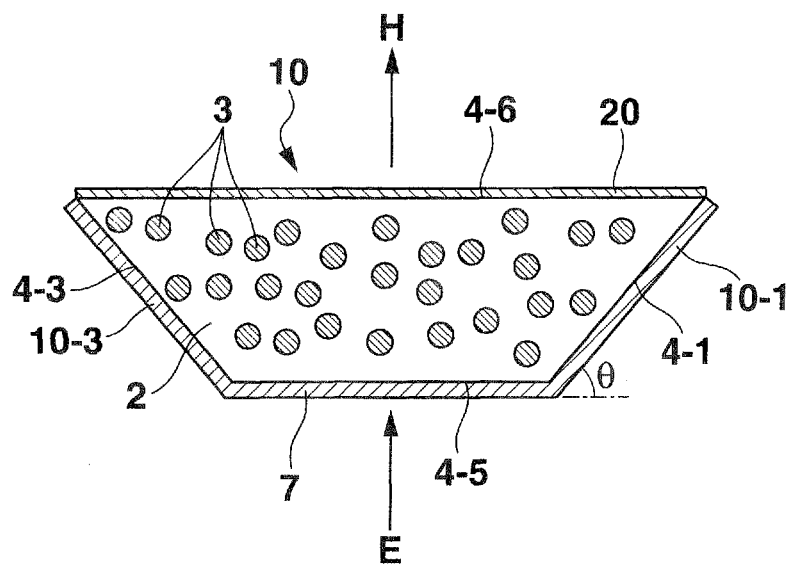
FIG. 6 is a diagram showing the configuration of a phosphor device according to a sixth embodiment of the invention.

FIG. 6 is a sectional view of the phosphor device 10 according to the fifth embodiment. The components identical to those shown in FIG. 5 are designated by the same reference numbers and will not be described in detail.

This phosphor device 10 includes a thin reflection preventing film 20 formed on the output face 4-6. The reflection preventing film 20 prevents the reflection of light having a wavelength outside, for example, a visible-light region of 400 cm to 700 cm. The reflection preventing film 20 is a multi-layered optical reflection preventing film composed of layers of a metal oxide and metal fluoride, one laid on another. Representative examples of the metal oxide are TiO2, SiO2, and Al2O3. A representative example of the metal fluoride is MgF2. The reflection preventing film 20 may have depressions and tiny projections arranged at a pitch shorter than, for example, the wavelength in the visible-light region. The reflection preventing film 20 has been formed by transferring the pattern from a mold or by etching a film, at the time of sintering during the manufacture of the phosphor device 10.

If blue excitation light E (wavelength ranging form 455 nm to 492 cm), for example, enters the phosphor device 10 so configured as described above, at the input face 4-5, it is applied to the phosphor particles 3 dispersed in the inorganic binder 2. Excited with the excitation light E, each phosphor particle 3 emits, for example, green light (having a wavelength ranging from 492 nm to 577 nm).

Of the light beams emitted from each phosphor particle 3, some travel to the output face 4-6, pass through the reflection preventing film 20 formed on the output face 4-6 and emerge outside the phosphor device 10, and some travel to the input face 4-5, are reflected at the lateral face 4-5, further travel to the output face 4-6, pass through the reflection preventing film 20 formed on the output face 4-6 and emerge outside the phosphor device 10.

The light beams emitted from each phosphor particle 3 and radiated to the lateral faces 4-1 to 4-4 are reflected by the reflection films 10-1 to 10-4, and travel to the output face 4-6. The reflection films 7 10-1 to 10-4 are formed on the lateral faces 4-1 to 4-4 of a square truncated pyramid, and are inclined by, for example, 45'. Therefore, the light beams reflected by the reflection films 10-1 to 10-4 are efficiently guided to the output face 4-6, pass through the reflection preventing film 20 formed on the output face 4-6, and emerge outside the phosphor device 10.

Thus, in the phosphor device 10 according to the second embodiment, the reflection preventing film 20 is formed on the output face 4-6. Therefore, the sixth embodiment can not only achieve the same advantage as the first embodiment, but also prevent light beams of any wavelengths outside the visible-light region (i.e., 400 nm to 700 nm) from being reflected.

As shown in FIG. 6, the reflection preventing film 20 is formed on the output face 4-6 of the phosphor device 10. In the fourth embodiment, a reflection preventing film 20 may be formed on the output face 4-6 of the phosphor device 10 shown in FIG. 4.

Seventh Embodiment

A seventh embodiment of this invention will be described with reference to FIG. 7.

Figure 7:
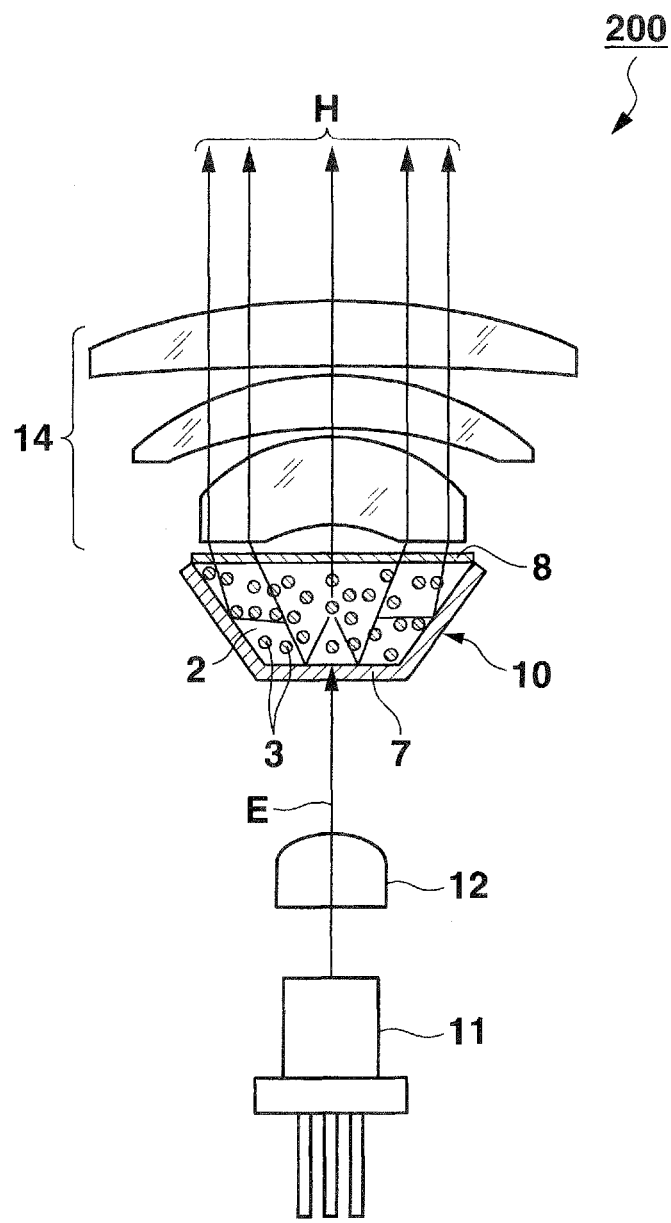
FIG. 7 is diagram showing the configuration of an illumination apparatus according to a seventh embodiment of the invention, which uses a phosphor device.

FIG. 7 is diagram showing the configuration of an illumination apparatus 200 using a phosphor device 10. The components identical to those shown in FIG. 4A, FIG. 4B, FIG. 5 and FIG. 6 are designated by the same reference numbers and will not be described in detail.

The illumination apparatus 200 uses the phosphor device 10 shown in FIG. 4A and FIG. 4B.

As shown in FIG. 7, the illumination apparatus 200 comprises a semiconductor laser 11 used as source of excitation light. On the path of the excitation laser beam E output from the semiconductor laser 11, a collimator lens 12, a phosphor device 10, and a light-collecting optical system 14 are arranged.

The collimator lens 12 collimates the excitation laser beam E output from the semiconductor laser 11. The excitation laser beam E collimated is applied to all of the lateral faces 4-1 to 4-4 and entire input face 4-5 of the phosphor device 10. However, the excitation laser beam E may not be applied to all of the lateral faces 4-1 to 4-4. Rather, it may be applied to only those parts of the lateral faces 4-1 to 4-4, which are continuous to the sides of the input face 4-5.

The light-collecting optical system 14 collects and focuses the light beams emitted from the phosphor device 10, and outputs these light beams as illumination light H.

In the illumination apparatus 200 configured as described above, the semiconductor laser 11 may emit an excitation laser beam E having a wavelength in the blue region. If this is the case, the excitation laser beam E is collimated by the collimator lens 12 and applied to all of lateral faces 4-1 to 4-4 and to the entire input face 4-5.

In the phosphor device 10, the excitation laser beam E is applied to the phosphor particles 3 dispersed in the inorganic binder 2. Excited with the excitation laser beam E, each phosphor particle 3 emits light beams, for example, of green light (having a wavelength ranging from 492 nm to 577 nm). Of these light, beams, some traveling to the output face 4-6 pass the output face 4-6 and emerge outside the phosphor device 10. Some beams are radiated toward the input face 4-5 and reflected by the dichroic film 7 formed on the input face 4-5, then travel to the output face 4-6, pass through the output face 4-6, and emerge outside the phosphor device 10. Other beams travel toward the lateral faces 4-1 to 4-4, are reflected by the dichroic films 7 formed on the lateral faces 4-1 to 4-4, travel to the output face 4-6, pass through the output face 4-6 and emerge outside the phosphor device 10.

The green light beams output from the phosphor device 10 are collected by the light-collecting optical system 14 and output as illumination light H from the illumination apparatus 200.

As described above, the illumination apparatus 200 according to the seventh embodiment comprises a phosphor device 10. In the illumination apparatus 200, the excitation laser beam H output from the semiconductor laser 11 is applied through the collimator lens 12 to the phosphor device 10. The phosphor device 10 emits green light beams H, which pass through the light-collecting optical system 14. The light beams H can therefore be efficiently emitted, as illumination light, from the phosphor device 10.

The seventh embodiment uses a phosphor device 10 of the type shown in FIG. 4A and FIG. 4B. However, instead, a phosphor device of the type shown in FIG. 5 or FIG. 6 may be used. Assume that the phosphor device 10 of FIG. 6 is used. Then, the reflection preventing film 20 is formed on the output face 4-6 and allows passage of the light emitted from each phosphor particle 3 and also the excitation laser beam E not used to excite any phosphor particles 3. That is, the light emitted from phosphor particles 3 and the excitation laser beam E passes through the reflection preventing film 20 and emerges outside the phosphor device 10. The light emitted from phosphor particles 3 and the excitation laser beam E not used to excite the phosphor particles 3 is collected by the light-collecting optical system 14, and then output as mixed illumination light H.

Eighth Embodiment

Figure 8:
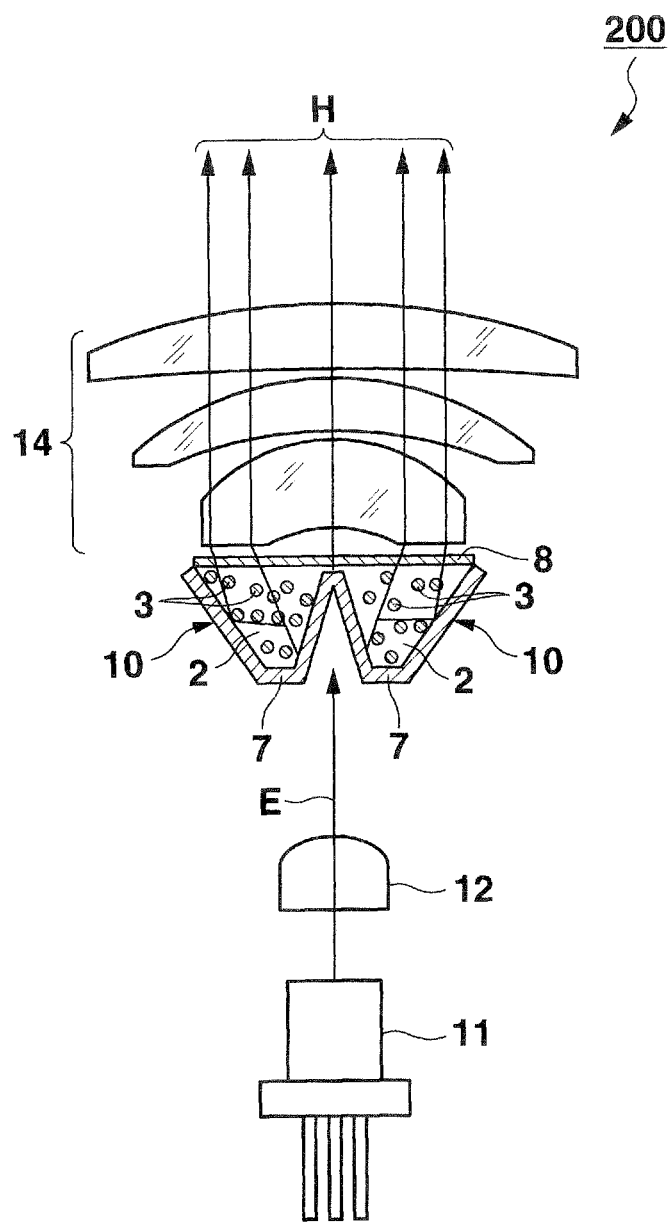
FIG. 8 is a diagram showing the configuration of an illumination apparatus according to an eighth embodiment of the invention, which uses two phosphor devices.

An eighth embodiment of this invention will be described with reference to FIG. 8. FIG. 8 is a diagram showing the configuration of an illumination apparatus 200 according to an eighth embodiment of the invention, which uses two phosphor devices. The components identical to those shown in FIG. 7 are designated by the same reference numbers and will not be described in detail.

As shown in FIG. 8, two phosphor devices 10 are arranged on the optical path of the excitation laser beam E emitted from a semiconductor laser 31. The phosphor devices 10 are arranged integral with each other and having their input/output faces 4-6 in the same plane. The phosphor devices 10 are arranged in one region, where both can receive an excitation laser beam E.

In the illumination apparatus 200 configured as described above, the semiconductor laser 31 may emit an excitation laser beam E having a wavelength in the blue region. The excitation laser beam E is collimated by a collimator lens 32 and applied to, for example, the entire dichroic films 7 formed on the lateral faces 4-1 to 4-4 of each phosphor device 10.

In either phosphor device 10, the excitation laser beam E is applied to the phosphor particles 3 dispersed in the inorganic binder. Excited with the excitation laser beam E, each phosphor particle 3 emits blue light beams (including a wavelength ranging from 492 nm to 577 cm). Of these light beams, some travel to the output face 4-6, pass through the output face 4-6 and emerge outside the phosphor device 10, some travel toward the input face 4-5, are reflected by the dichroic films 7 formed on the input face 4-5, travel to the output face 4-6, pass through the output face 4-6 and emerge outside the phosphor device 10, and others, which are radiated toward the lateral faces 4-1 to 4-4, are reflected by the dichroic films 7 formed on the lateral faces 4-1 to 4-4, travel to the output face 4-6, pass through the output face 4-6 and emerge outside the phosphor device 10.

The green light beams output from both phosphor devices 10 are collected and focused by a light-collecting optical system 14, and output as illumination light H.

Thus, in the illumination apparatus 200 according to the eighth embodiment, two phosphor devices 10 are arranged integral with each other and in one region, where both can receive an excitation laser beam E. The light beams efficiently acquired from the two phosphor devices 10 can therefore be output as illumination light H. Hence, the illumination apparatus 200 can generate more illumination light than by using one phosphor device 10.

Figure 9A:
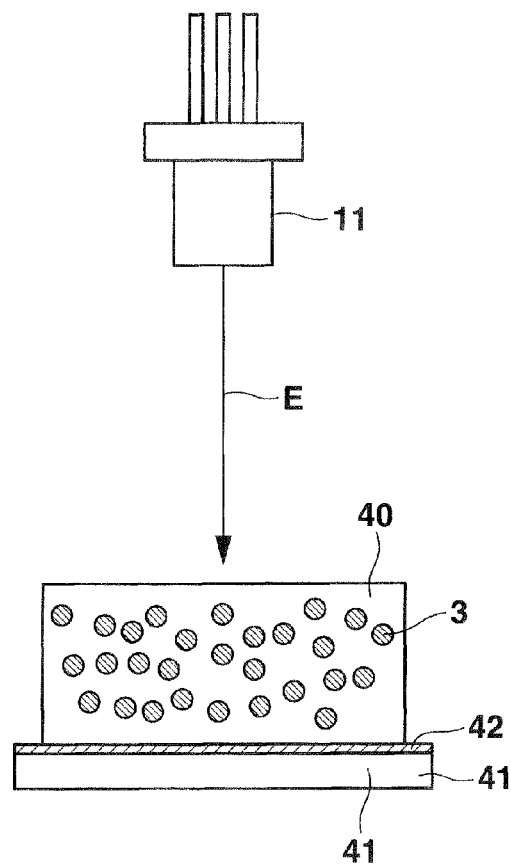
FIG. 9A is a diagram showing the configuration of a phosphor device using an inorganic binder, which is the prior art of this invention.
Figure 9B:
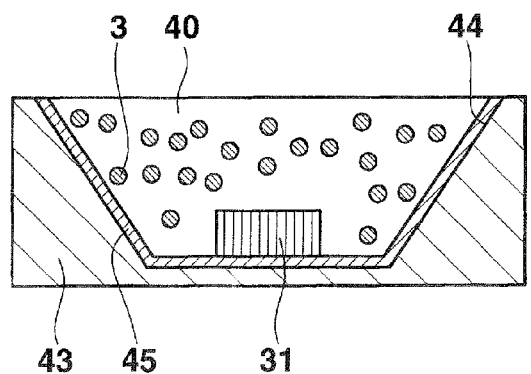
FIG. 9B is a diagram showing the configuration of another phosphor device using an inorganic binder, which is also the prior art of this invention.

In the illumination apparatus 200, the semiconductor laser 31 used as a source of excitation light may be provided outside an inorganic binder 40 containing phosphor particles 3, as shown in FIG. 9A, or in an inorganic binder 40 as shown in FIG. 9B. In the configuration of FIG. 9A, the inorganic binder 40 is mounted on a reflection film 42, which in turn is mounted on a substrate 41. In the configuration of FIG. 9B, the inorganic binder 40 is provided in the hole 44 made in a substrate 43 and having inclined faces, and reflection films 45 are formed on the inclined faces of the hole 44.

Figure 10:
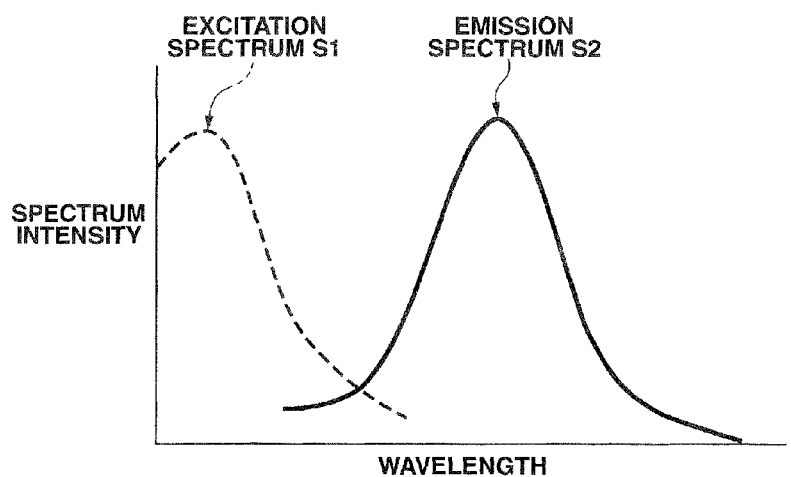
FIG. 10 is a diagram showing how two excitation spectra overlap, at the long-wavelength part of the former and at the short-wavelength part of the other, in the prior-art phosphor device.
Figure 11:
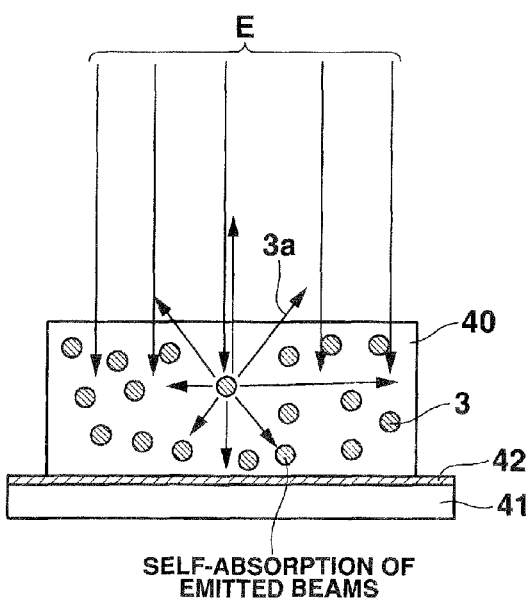
FIG. 11 is a diagram explaining a phenomenon called "self-absorption" that occurs in the prior-art phosphor device.

The phosphor particles 3 used in most illumination apparatuses of this type exhibit two excitation spectra, S1 and S2, as shown in FIG. 10. As seen from FIG. 10, the long-wavelength part of the spectrum S1 overlaps the short-wavelength part of the spectrum S2. Therefore, the light beams 3a emitted from each phosphor particle 3 may be applied to some other phosphor particles 3, while traveling in the inorganic binder 2. That is, the light beams 3a may excite some other phosphor particles 3, i.e., other activated atoms, causing a phenomenon known as "self-absorption," inevitably lowering the emission intensity of the phosphor particle 3.

By contrast, in the sixth embodiment described above, the light beams emitted from the phosphor particles 3 dispersed in the inorganic binders 2 of either phosphor device 10 directly emerge outside the phosphor devices 10, from the input/output faces 4-6, or are first reflected at the flat reflection face 4-5 or the inclined reflection faces 4-1 to 4-4, then pass through the input/output faces 4-6 and are output at high efficiency. Hence, self-absorption, which excites other activated atoms and ultimately lowers the emission intensity of each phosphor particle 3, would not occur. Note that self-absorption would not occur in the first and second embodiments, either.

In the eighth embodiment, of the light beams, e.g., green beams, emitted from the phosphor particles 3 dispersed in the organic binder 2 of either phosphor device 10, some directly emerge outside the phosphor device 10, from the output face 4-6, or are first reflected by the dichroic films 7 formed on the lateral faces 4-1 to 4-4, then pass through the output face 4-6 and finally emerge at high efficiency. Therefore, the light beams would not excite other activated atoms to cause self-absorption that lowers the emission intensity of the phosphor particle 3. Note that self-absorption would not occur in the fourth to seventh embodiments, either.

Ninth Embodiment

A ninth embodiment of this invention will be described with reference to the drawing.

Figure 12:
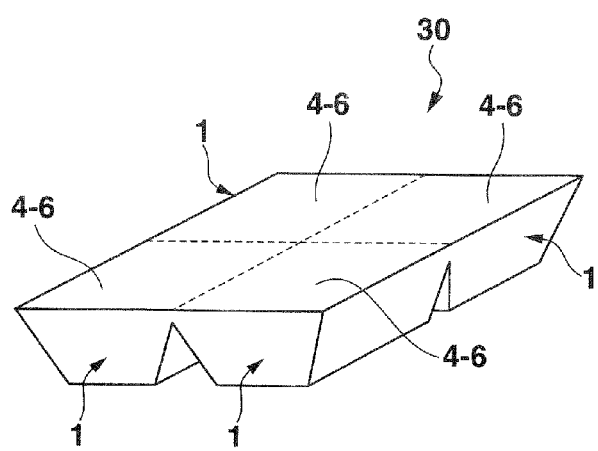
FIG. 12 is a diagram showing an illumination apparatus according to a ninth embodiment of the invention, which uses a plurality of phosphor devices.
Figure 13:
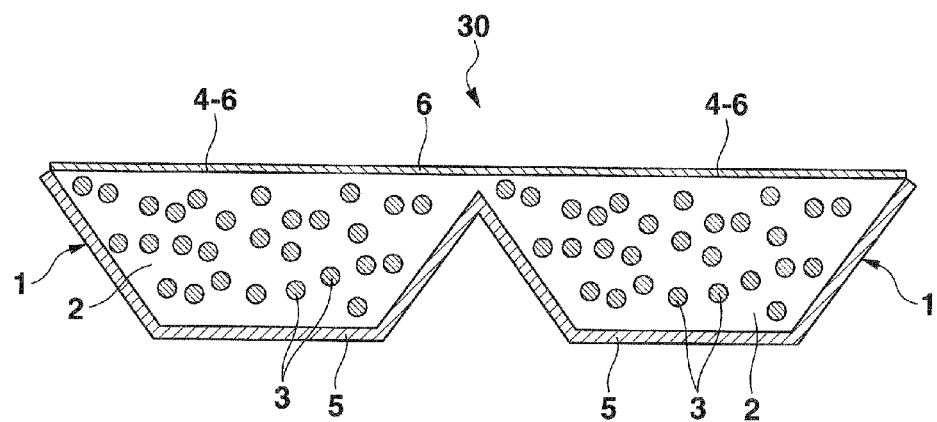
FIG. 13 is a sectional view of the phosphor devices used in the ninth embodiment.

In the third embodiment, two phosphor devices 1 are arranged on the substrate 21. Alternatively, two or more phosphor devices may be used. For example, as shown in FIG. 12, four phosphor devices 1 may be arranged, forming a matrix pattern, and held in position. As shown in FIG. 13, the phosphor devices 1 are arranged with their second faces, i.e., output-input faces 4-6, set in the same plane, and are formed integral with one another. The phosphor devices 1 are arranged in one region, where they can receive an excitation laser beam E.

The number of phosphor devices 1 used is not limited to four. More than four phosphor devices 1 may be arranged, forming a matrix pattern. The pattern the phosphor devices 1 form is not limited to a matrix pattern. Alternatively, the phosphor devices 1 may be arranged at regular intervals, in a vertical direction or in a horizontal direction. Still alternatively, they may be arranged in concentric circles or at random positions.

In the illumination apparatus including the phosphor devices 1 so arranged, a semiconductor laser 11 may output an excitation laser beam E in the blue region. The excitation laser beam E is collimated by a collimator lens 12 and then applied to a dichroic mirror 13. The excitation laser beam E passes through the dichroic mirror 13, and is focused by a light-collecting optical system 14. The beam E focused is applied to, for example, four phosphor devices 1.

At each phosphor device 1, the excitation laser beam E enters the input-output face 4-6, exciting the phosphor particles 3 dispersed in the inorganic binder 2. Excited with the excitation laser beam E, each phosphor particle 3 emits light beams having a wavelength in, for example, the blue region. Of these light beams, some directly emerge outside the phosphor device 1, from the input/output face 4-6, and some are first reflected by the reflection films 5 formed on the flat reflection face 4-5 and inclined reflection faces 4-1 to 4-4, and then pass through the input/output face 4-6.

The light beams having a wavelength in the green region, emitted from each phosphor device 1, pass through the light-collecting optical system 14 and are applied to the dichroic mirror 13. The dichroic mirror 13 reflects the light beams, which emerge as illumination light from the illumination apparatus.

In the ninth embodiment described above, several phosphor devices 1, for example, four phosphor devices 1, are arranged integral with one another, and located in one region, where they can receive the excitation laser beam F. The light beams emitted from each phosphor particle 3 can thereby be efficiently output as illumination light from any one of the phosphor devices 1. Since the light beams efficiently emitted from the phosphor particles 3 of the four phosphor devices 1 are output as illumination light, the illumination apparatus can generate more illumination light than by using one phosphor device 1.

Tenth Embodiment

A tenth embodiment of this invention will be described with reference to FIG. 14.

Figure 14:
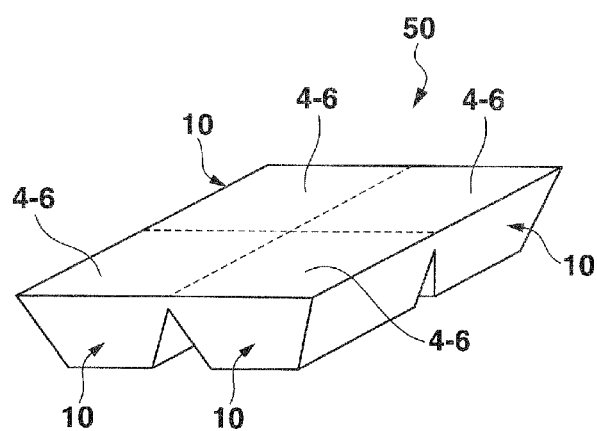
FIG. 14 is a diagram showing the configuration of an illumination apparatus according to a tenth embodiment of the invention, which uses a plurality of phosphor devices.
Figure 15:
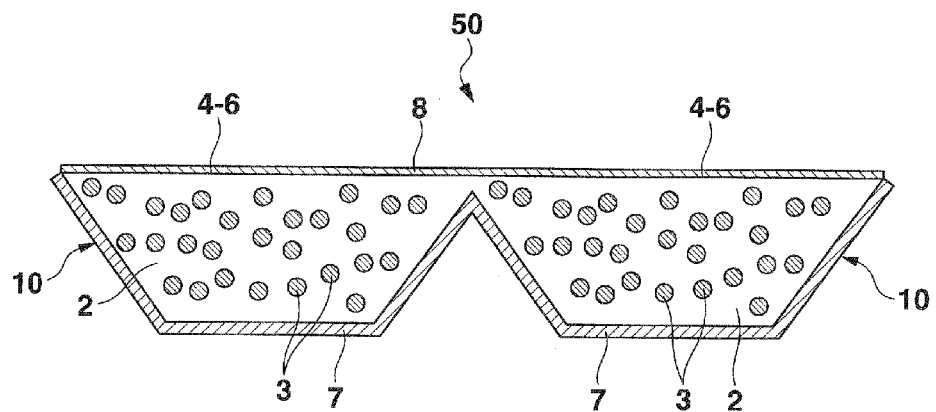
FIG. 15 is a sectional view of the phosphor devices used in the illumination apparatus of FIG. 14.

FIG. 14 is a perspective view of a phosphor-device assembly 50 composed of two or more phosphor devices. As shown in FIG. 14, the assembly 50 is composed of four phosphor devices 10, not two phosphor devices 10 as in the eighth embodiment. The four phosphor devices 10 are arranged, forming a matrix pattern. As shown in FIG. 15, the phosphor devices 10 are arranged with their output faces 4-6 set in the same plane, and are formed integral with one another. The phosphor devices 10 are located in one region, where they can receive the excitation laser beam F.

The number of phosphor devices 10 used is not limited to four. More than four phosphor devices 10 may be arranged, forming a matrix pattern. The pattern the phosphor devices 10 form is not limited to a matrix pattern. Alternatively, the phosphor devices 10 may be arranged at regular intervals, in a vertical direction or in a horizontal direction. Still alternatively, they may be arranged in concentric circles or at random positions.

The phosphor devices 10 may be used to constitute an illumination apparatus 200, similarly to the apparatus 200 shown in FIG. 8, which has only two phosphor devices. The four phosphor devices 10 are arranged on the optical path of the excitation laser beam E emitted from a semiconductor laser 31.

In the illumination apparatus 200, the semiconductor laser 31 may emit an excitation laser beam E of a wavelength in the blue region. The excitation laser beam E is collimated by a collimator lens 32. The beam E collimated is applied to, for example, all the entire dichroic films 7 formed on the lateral faces 4-1 to 4-4 and input face 4-5 of every phosphor device 10.

In each phosphor device 10, the excitation laser beam E is applied to the phosphor particles 3 dispersed in the inorganic binder 2. Excited with the excitation laser beam E, each phosphor particle 3 emits light beams of a wavelength in, for example, the green region (492 nm to 577 nm). Of the light beams, some travel to the output face 4-6, pass through the output face 4-6 and emerge outside the phosphor device 10, some travel toward the input face 4-5, are reflected by the dichroic film 7 formed on the input face 4-5, travel to the output face 4-6, pass the output face 4-6 and emerge outside the phosphor device 10, and others travel toward the lateral faces 4-1 to 4-4, are reflected by the dichroic films formed on the lateral faces 4-1 to 4-4, further travel to the output face 4-6, pass the output face 4-6 and emerge outside the phosphor device 10.

The light beams emitted from each phosphor device 10 and having a wavelength in the green region are collected by a light-collecting optical system 14 and output as illumination light H.

In the tenth embodiment, several phosphor devices 10 are arranged integral with one another, and located in one region, where they can receive the excitation laser beam E. The light beams emitted from each phosphor particle 3 can thereby be efficiently output as illumination light from any one of the phosphor devices 10. Since the light beams efficiently emitted from the phosphor particles 3 of the four phosphor devices 10 are output as illumination light, the illumination apparatus can generate more illumination light than by using one phosphor device 10.

In the tenth embodiment, phosphor devices 10 of the type shown in FIG. 4A and FIG. 4B are arranged, forming a matrix pattern. Instead, the phosphor devices 10 of the type shown in FIG. 5 or FIG. 6 may be arranged, forming a matrix pattern.

Eleventh Embodiment

An eleventh embodiment of this invention will be described with reference to FIG. 16.

Figure 16:
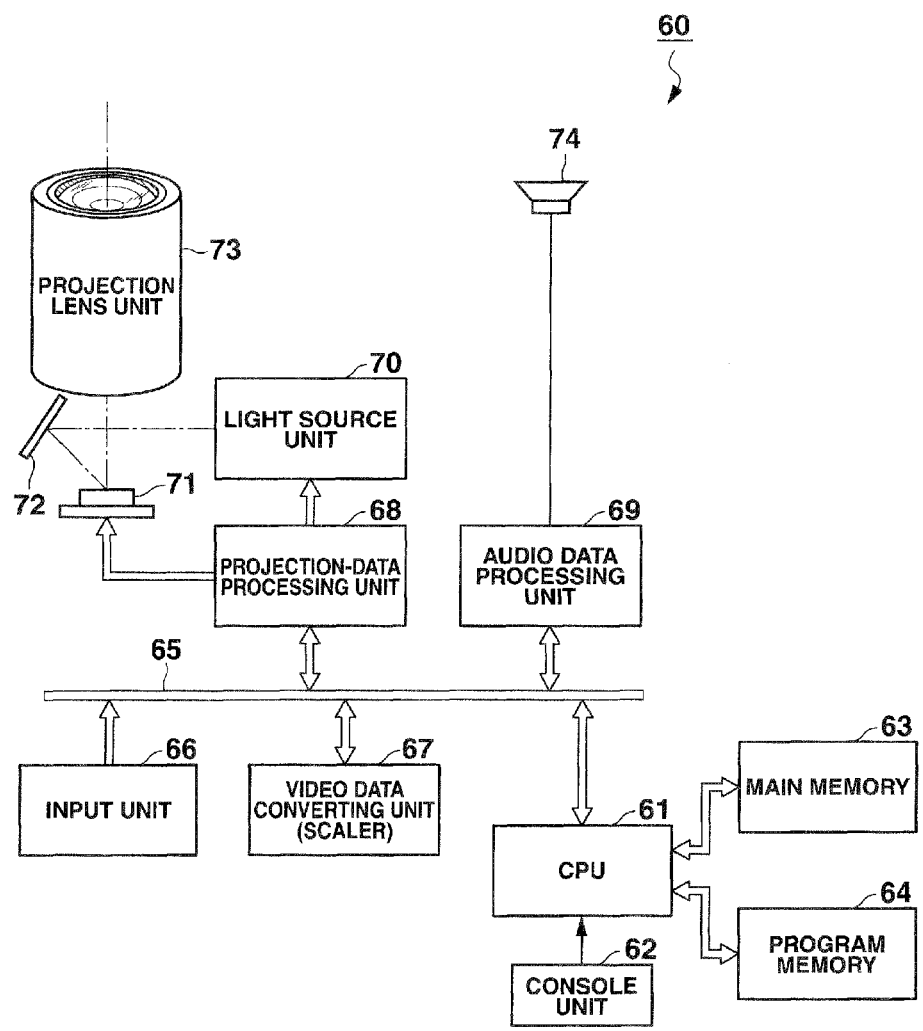
FIG. 16 is a diagram showing a projector apparatus using the illumination apparatus according to an eleventh embodiment of the invention.

FIG. 16 shows a configuration of a projector apparatus 60 including the illumination apparatus 100 of FIG. 2 or the illumination apparatus 200 of FIG. 7. The projector apparatus 60 adopts the digital light processing (DLP) system (trademark). The projector apparatus 60 incorporates a CPU 61. To the CPU 61, a console unit 62, a main memory 63, and a program memory 64 are connected. Further, an input unit 66, a video data converting unit 67, a projection-data processing unit 68 and an audio data processing unit 69 are connected to the CPU 61 by a system bus 65. To the projection data processing unit 68, a light source unit 70 and a micro-mirror element 71 are connected. A mirror 72 is provided on the optical path of the illumination light emitted from the light source unit 70. A projection lens unit 73 is arranged on the reflection optical path of the micro-mirror element 71. A speaker unit 74 is connected to an audio data processing unit 69.

The video data converting unit 67 is configured to receive analog video signals of various standards, covert the analog video signals to a digital video signal and supply the digital video data via the system bus 65 to the video data converting unit 67.

The video data converting unit 67, also called a "scaler," converts the video data input from the video data converting unit 67 to video data of a prescribed format fit for image projection. The video data so converted is supplied to the projection data processing unit 68. At this point, the video data converting unit 67 superimposes data such as symbols indicating various operating states for on-screen display (OSD) on the video data, if necessary, and sends the video data, so processed, to the projection data processing unit 68.

The projection data processing unit 68 drives the micro-mirror element 71 (i.e., spatial optical conversion element) in accordance with the video data sent from the video data converting unit 67, by means of high-speed time division driving in which the frame rate (e.g., 60 frames/sec) for a prescribed format is multiplied by the component divisor and the number of display gradations.

The audio data processing unit 69 includes a sound source circuit such as a pulse-code modulation (PCM) sound source. The audio data processing unit 69 converts the audio data for image projection, to analog audio data. The analog audio data drives the speaker unit 74, which generates sound. If necessary, the audio data processing unit 69 causes the speaker unit 74 to generate a beep.

The micro-mirror element 71 is, for example, a wide extended graphic array (WXGA), comprising tiny mirrors arranged in, for example, 1250 rows and 800 columns (i.e., 1250×800 pixels). In the micro-mirror element 71, the tiny mirrors are switched on and off at high speed, each independently of any other, reflecting light and thereby forming an optical image.

The light source unit 70 cyclically emits illumination light beams, i.e., primary-color beams (red (R), green (G) and blue (B)) via a time-division scheme. The R beams, G beams and B beams cyclically emitted from the light source unit 70 are totally reflected by the mirror 72 and applied to the micro-mirror element 71. At the micro-mirror element 71, the light beams form an optical image. The optical image so formed is projected through the projection lens unit 73 and displayed, as a color image, on a screen (not shown).

The light source unit 70 includes illumination apparatuses, such as the illumination apparatus 100 of FIG. 2 and the illumination apparatus 200 of FIG. 7. The light source unit 70 comprises a semiconductor laser configured to emit a laser beam having a wavelength in the red (R) region (622 nm to 777 nm), a semiconductor laser 11 configured to emit a laser beam having a wavelength in the blue (B) region (455 nm to 429 nm), and a semiconductor laser 31 configured to emit a laser beam having a wavelength in the green region. The red laser beam, green laser beam and blue laser beam are emitted from these semiconductor lasers via time division, and are used as excitation light beams.

The light source unit 70 may comprise illumination apparatuses other than the apparatus 100 of FIG. 2 or the apparatus 200 of FIG. 7.

In accordance with the instructions input at the console unit 62, the CPU 61 reads and writes data from and in the main memory 63, and executes the programs stored in the program memory 64. The CPU 61 controls, via the system bus 65, the input unit 66, video data converting unit 67, projection data processing unit 68 and audio data processing unit 69. That is, the CPU 61 uses the main memory 63 and the program memory 64, controlling the other components of the projector apparatus 60.

The main memory 63 is constituted by, for example, a SRAM, and functions work memory for the CPU 61. The program memory 64 is constituted by an electrically programmable nonvolatile memory, and stores the operating program and various fixed data.

The CPU 61 performs various projection processes in response to the key signals input at the console unit 62. The console unit 62 includes a key unit and an infrared-ray receiving unit. The key unit is provided on the main unit of the projector apparatus 60. The infrared-ray receiving unit is configured to receive infrared rays emitted from a remote controller dedicated to the projector apparatus 60. The user may operate the key unit or the remote controller. In this case, the console unit 62 supplies the key signals generated at the key unit or remote controller, directly to the CPU 61.

In the projector apparatus 60 configured as described above, the input unit 66 processes any analog video signal of any standard it has received, generating digital video data. The digital video data is sent via the system bus 65 to the video data converting unit 67.

The video data converting unit 67 converts the video data input from the input unit 66 to video data of a prescribed format fit for image projection. The video data converting unit 67 further superimposes, on the video data, symbol data for OSD, which represents the various operating modes in which the projector apparatus 60 is operating. The video data superimposed with the symbol data is supplied to the projection data processing unit 68.

In accordance with the video data supplied from the video data converting unit 67, the projection data processing unit 68 performs, on the micro-mirror element 71, a high-speed time-division drive in which the frame rate based on the prescribed format, e.g., 60 frames/sec, is multiplied by the color-component divisor and the number of display gradations.

In the micro-mirror element 71 so driven by the projection data processing unit 68, the tiny mirrors are switched on and off at high speed, changing their inclination angles. Therefore the light beams that the tiny mirrors reflect form an optical image.

Meanwhile, the light source unit 70 emits the illumination light in the green (G) region output from the apparatus 100 of FIG. 2 or illumination apparatus 200 of FIG. 7, the laser beam having a wavelength in the blue (B) region and emitted from the semiconductor laser 11, and the laser beam having a wavelength in the red (R) region and emitted from another semiconductor laser, cyclically via time-division. The illumination light beams R, G and B sequentially emitted from the light source unit 70 are totally reflected by the mirror 72 and then applied to the micro-mirror element 71, which forms an optical image. The color image is projected on a screen through the projection lens unit 73 functioning as a projection optical system.

In the meantime, the audio data processing unit 69 converts the digital audio data to analog audio data, which is supplied to the speaker unit 74. The speaker unit 74 generates sound from the analog audio data. Alternatively, the speaker unit 74 generates a beep, as needed.

As described above, the illumination apparatus 100 of FIG. 2 or the illumination apparatus 200 of FIG. 7 is used as light source unit 70 in the projector apparatus 60 according to the eleventh embodiment. Since the light beams emitted from each phosphor particle 3 can efficiently emerge from the phosphor device 1 or 10, the projector apparatus 60 can project a color image on a screen.

It should be noted that the present invention is not limited to the embodiments described above. The components of any embodiment can be modified in various manners in reducing the invention to practice, without departing from the spirit or scope of the invention. Further, the components of the embodiments described above may be combined, if necessary, in appropriate ways, thereby to make different inventions. For example, some of the components of the embodiment may not be used. Moreover, the components of different embodiments of the invention may be combined in any desired fashion.

What is claimed is:

1. A phosphor device comprising:
a body including phosphor particles, the body comprising a sintered inorganic material containing the phosphor particles and having been shaped like a pyramid or cone, and the body including an inclined face and first and second faces opposed to each other,
wherein the first face includes a smaller area than the second face, the first face and the inclined faces have reflection layers configured to reflect light beams emitted from the phosphor particles and including a wavelength in a visible-light region, the second face includes a reflection preventing film formed directly on the second face and configured to allow passage of the light beams emitted from the phosphor particles, and the second face is an input face for excitation light for exciting the phosphor particles and also an output face for the light beams emitted from the phosphor particles.

2. The phosphor device according to claim 1, wherein the body is shaped like a square pyramid, a hexagonal pyramid or a cone.

3. The phosphor device according to claim 1, wherein the reflection preventing film is formed by forming depressions and projections arranged at a pitch shorter than, for example, a wavelength in the visible-light region.

4. A phosphor device comprising a plurality of phosphor devices of the type described in claim 1.

5. An illumination apparatus comprising:
a phosphor device of the type described in claim 1;
an excitation light source configured to output an excitation light;
a light applying optical system configured to apply the excitation light output from the excitation light source, to the phosphor device; and
a light output system configured to output light emitted from the phosphor device as illumination light.

6. The illumination apparatus according to claim 5, wherein the light output system includes a dichroic mirror configured to allow passage of the excitation light and to reflect the light emitted from the phosphor device.

7. A projector apparatus comprising:
an illumination apparatus of the type described in claim 5; and
a projection optical system configured to project a color image including the illumination light output from the illumination apparatus.

8. A phosphor device comprising:
a body including phosphor particles, shaped like a pyramid or cone and having an inclined face and first and second faces opposed to each other,
wherein the first face includes a smaller area than the second face, a first film is provided on the first face and parts of the incline faces, which allows passage of excitation light for exciting the phosphor particles and reflects light beams emitted from the phosphor particles, toward the second face, and the light beams pass through the second face and emerge from the body.

9. The phosphor device according to claim 8, wherein a second film is formed on the second face, which reflects the excitation light and allows passage of the light beams.

10. The phosphor device according to claim 8, wherein the first film is formed on the first face, and reflection films are formed on the inclined faces, which reflect the light beams emitted from the phosphor particles.

11. The phosphor device according to claim 8, wherein the first film includes a dichroic film.

12. The phosphor device according to claim 8, wherein the second film includes a dichroic film.

13. The phosphor device according to claim 8, wherein the body is shaped like a square pyramid, a hexagonal pyramid or a cone.

14. The phosphor device according to claim 8, wherein the body has been made by sintering an inorganic material including the phosphor particles and then shaping a resultant product like a pyramid or cone.

15. The phosphor device according to claim 8, wherein on the second face, a reflection preventing film is formed and prevents light having any wavelength other than the wavelength of the excitation light and the wavelength of the light beams emitted from the phosphor particles.

16. The phosphor device according to claim 15, wherein the reflection preventing is formed by forming depressions and projections arranged at a pitch shorter than, for example, a wavelength in the visible-light region.

17. A phosphor device comprising a plurality of phosphor devices of the type described in claim 8.

18. An illumination apparatus comprising:
a phosphor device of the type described in claim 8;
an excitation light source configured to output excitation light;
an optical system configured to apply the excitation light emitted from the excitation light source, to the first face of the phosphor device; and
a light-collecting optical system configured to collect the light beams emitted from the second face of the phosphor device to output the light beams as illumination light.

19. A projector apparatus comprising:
an illumination apparatus of the type described in claim 18; and
a projection optical system configured to project a color image including the illumination light output from the illumination apparatus.

* * * * *